US009903918B2

(12) United States Patent
Ose

(10) Patent No.: US 9,903,918 B2
(45) Date of Patent: Feb. 27, 2018

(54) APPARATUS AND METHOD FOR INSPECTING ALL-SOLID BATTERY

(75) Inventor: Norihiro Ose, Suntou-gun (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 94 days.

(21) Appl. No.: 14/385,592

(22) PCT Filed: Apr. 19, 2012

(86) PCT No.: PCT/JP2012/060621
§ 371 (c)(1),
(2), (4) Date: Sep. 16, 2014

(87) PCT Pub. No.: WO2013/157128
PCT Pub. Date: Oct. 24, 2013

(65) Prior Publication Data
US 2015/0048838 A1    Feb. 19, 2015

(51) Int. Cl.
*H02J 7/00* (2006.01)
*G01R 31/36* (2006.01)

(52) U.S. Cl.
CPC ..... *G01R 31/3662* (2013.01); *G01R 31/3606* (2013.01); *G01R 31/3624* (2013.01); *G01R 31/3648* (2013.01); *G01R 31/3651* (2013.01); *G01R 31/3679* (2013.01); *G01R 31/3641* (2013.01)

(58) Field of Classification Search
CPC .......................... G01R 31/3606; G01R 31/3679
USPC ........................................... 320/132; 324/434
See application file for complete search history.

(56) References Cited

U.S. PATENT DOCUMENTS

| 2005/0030041 A1* | 2/2005 | Koo | G01R 31/3631 |
| | | | 324/433 |
| 2006/0284618 A1* | 12/2006 | Cho | B60L 11/1861 |
| | | | 324/430 |
| 2009/0051364 A1* | 2/2009 | Ishida | H02J 7/1461 |
| | | | 324/430 |
| 2010/0052618 A1* | 3/2010 | Inoue | G01R 31/3662 |
| | | | 320/134 |
| 2011/0156660 A1* | 6/2011 | Cheng | H01M 10/44 |
| | | | 320/157 |
| 2011/0301891 A1* | 12/2011 | Kim | B60L 3/0046 |
| | | | 702/63 |

(Continued)

FOREIGN PATENT DOCUMENTS

JP    A-2010-40198    2/2010

*Primary Examiner* — Samuel Berhanu
(74) *Attorney, Agent, or Firm* — Oliff PLC

(57) ABSTRACT

An object of the present invention is to provide an apparatus for inspecting an all-solid battery with which a battery capacity where a voltage abnormality occurs can be grasped before the voltage abnormality occurs. The present invention is an apparatus for inspecting an all-solid battery including a storage section storing a relationship between the battery capacity where the voltage abnormality occurs and a resistance of the all-solid battery, and a resistance calculation section calculating the resistance based on a current and voltage in charging the all-solid battery, wherein the battery capacity where the voltage abnormality occurs in the all-solid battery is calculated from the relationship stored in the storage section and the resistance calculated in the resistance calculation section.

10 Claims, 4 Drawing Sheets

(56) References Cited

U.S. PATENT DOCUMENTS

| | | | |
|---|---|---|---|
| 2012/0150464 A1* | 6/2012 | Swanton | G01R 31/3689 702/63 |
| 2012/0306450 A1* | 12/2012 | Nakayama | G06F 1/263 320/134 |
| 2013/0057291 A1* | 3/2013 | Takahashi | G01R 31/3662 324/427 |
| 2013/0113433 A1* | 5/2013 | Shibata | B60L 11/14 320/134 |

* cited by examiner

APPARATUS AND METHOD FOR INSPECTING ALL-SOLID BATTERY

BACKGROUND OF THE INVENTION

Field of the Invention

The present invention relates to an apparatus and a method for inspecting an all-solid battery.

Description of the Related Art

A lithium-ion secondary battery has a higher energy density and is operable at a high voltage compared to conventional secondary batteries. Therefore, it is used for information devices such as a cellular phone, as a secondary battery which can be easily reduced in size and weight, and nowadays there is also an increasing demand for the lithium-ion secondary battery to be used as a power source for large-scale apparatuses such as electric vehicles and hybrid vehicles.

A lithium-ion secondary battery includes a cathode layer, an anode layer, and an electrolyte layer disposed between them. An electrolyte to be employed in the electrolyte layer is, for example, a non-aqueous liquid or a solid. When the liquid is used as the electrolyte (hereinafter, the liquid being referred to as "electrolytic solution"), it easily permeates into the cathode layer and the anode layer. Therefore, an interface can be formed easily between the electrolytic solution and active materials contained in the cathode layer and the anode layer, and the battery performance can be easily improved. However, since commonly used electrolytic solutions are flammable, it is necessary to mount a system to ensure safety. On the other hand, if a nonflammable solid electrolyte (hereinafter referred to as "solid electrolyte") is used, the above system can be simplified. As such, a lithium-ion secondary battery provided with a layer containing a solid electrolyte has been suggested (hereinafter, the layer being referred to as "solid electrolyte layer" and the battery being referred to as "all-solid battery").

As a technique related to the lithium-ion secondary battery as described above, for example Patent Document 1 discloses a technique to charge a secondary battery in which an abnormality is detected in voltage and/or current in charging, with pulse waves and/or a low charging voltage.

CITATION LIST

Patent Literatures

Patent Document 1: Japanese Patent Application Laid-Open Publication No. 2010-40198

SUMMARY OF THE INVENTION

Problems to be Solved by Invention

In a case where the all-solid battery is employed to a vehicle or the like, it is presumed that the all-solid battery is rapidly charged. However, lithium insertion reaction into an anode becomes late in the rapid charging and brings a voltage abnormality, whereby it is sometimes difficult to charge the all-solid battery properly. Therefore, it is desired to identify an all-solid battery in which a voltage abnormality can occur, before the voltage abnormality occurs. However, with the technique disclosed in Patent Document 1, as shown in FIG. 9 and the like, until a voltage abnormality occurs, it was not possible to identify the battery in which the voltage abnormality occurs, and with the conventional technique, it was not possible to grasp the battery capacity in which the voltage abnormality occurs before the voltage abnormality occurs.

Accordingly, an object of the present invention is to provide an apparatus and method for inspecting an all-solid battery with which the battery capacity in which a voltage abnormality occurs can be grasped before the voltage abnormality occurs.

Means for Solving the Problems

As a result of an intensive study, the inventor of the present invention found out that there is a strong correlation between a resistance calculated by means of a voltage of an all-solid battery at a specific time (for example, few seconds after charging is started) in charging at a constant current, the battery having a predetermined value or less of state of charge (hereinafter, the resistance is referred to as "IV input resistance" and the term "state of charge" sometimes referred to as "SOC"), and a battery capacity at which an abnormality (hereinafter referred to as "voltage abnormality") occurs (hereinafter referred to as "battery capacity at which the a voltage abnormality occurs"), the abnormality which is a rapid lowering of the voltage of the all-solid battery in charging. Accordingly, it is presumed that it is possible to grasp the battery capacity at which the voltage abnormality occurs, before the voltage abnormality actually occurs, by measuring the IV input resistance of the all-solid battery having a predetermined value or less of state of charge and applying the measurement result to the relationship between the battery capacity at which the voltage abnormality occurs and the IV input resistance. The present invention has been made based on the above findings.

In order to solve the above problems, the present invention takes the following means. That is, a first aspect of the present invention is an apparatus for inspecting an all-solid battery including: a storage section storing a relationship between a battery capacity at which a voltage abnormality occurs in the all-solid battery and a resistance of the all-solid battery; and a resistance calculation section calculating the resistance based on a current and voltage of the all-solid battery in charging, wherein the apparatus calculates the battery capacity at which the voltage abnormality occurs in the all-solid battery, by means of the relationship stored in the storage section and the resistance calculated by the resistance calculation section.

Since there is a strong correction between the IV input resistance of the all-solid battery and the battery capacity at which the voltage abnormality occurs, it is possible to calculate the battery capacity at which the voltage abnormality occurs in the all-solid battery, before the voltage abnormality actually occurs, by identifying the relationship between the battery capacity at which the voltage abnormality occurs and the IV input resistance, and applying the resistance calculated by the resistance calculation section to the relationship. By calculating the battery capacity at which the voltage abnormality occurs in the all-solid battery before rapidly charging the all-solid battery (judging the quality of the battery before the voltage abnormality occurs), it is possible to reduce the charging rate in rapid charging from the initial plan or to replace the all-solid battery in which an occurrence of the voltage abnormality is presumed with another all-solid battery in which an occurrence of the voltage abnormality is not presumed. According to the first aspect of the present invention, since it is possible to provide countermeasures as above, it is possible to avoid occurrence of the voltage abnormality.

Also, in the first aspect of the present invention, it is preferable that the resistance calculation section calculates the resistance based on a current and voltage in charging the all-solid battery when the battery has a charging state of 0% or more and 20% or less. Since this configuration makes it easy to increase the correlation coefficient $R_2$ between the IV input resistance and the battery capacity at which the voltage abnormality occurs, it is possible to improve the calculation accuracy of the battery capacity at which the voltage abnormality occurs.

Also, in the first aspect of the present invention, it is preferable that the resistance calculation section calculates the resistance based on a current and voltage when the all-solid battery is charged at a constant current, and it is more preferable that the charging rate of the constant current is 10 C or less. Here, "C" means a charge-discharge rate representing a speed of charging and discharging all capacity of a battery. A current amount which charges all capacity of a battery for 1 hour is 1 C rate, and a tenfold current amount of 1 C rate is 10 C. Since this configuration makes it easy to increase the correlation coefficient $R_2$ between the IV input resistance and the battery capacity at which the voltage abnormality occurs, it is possible to improve the calculation accuracy of the battery capacity at which the voltage abnormality occurs.

A second aspect of the present invention is a method for inspecting an all-solid battery, the method including: a grasping step grasping a relationship between a battery capacity at which a voltage abnormality occurs in the all-solid battery and a resistance of the all-solid battery; a resistance calculation step calculating the resistance based on a current and voltage in charging the all-solid battery; and a capacity calculation step calculating the battery capacity at which the voltage abnormality occurs in the all-solid battery, from the relationship grasped at the grasping step and the resistance calculated in the resistance calculation step.

Since there is a strong correlation between the IV input resistance of the all-solid battery and the battery capacity at which the voltage abnormality occurs, it is possible to calculate the battery capacity at which the voltage abnormality occurs in the all-solid battery, before the voltage abnormality actually occurs, by identifying the relationship between the battery capacity at which the voltage abnormality occurs and the IV input resistance, and applying the resistance calculated in the resistance calculation step to the relationship. By calculating the battery capacity at which the voltage abnormality occurs in the all-solid battery before rapidly charging the all-solid battery (judging the quality of the battery before the voltage abnormality occurs), it is possible to reduce a charging rate in rapid charging from the initial plan, and replace the all-solid battery in which an occurrence of the voltage abnormality is presumed with another all-solid battery in which the occurrence of the voltage abnormality is not presumed. According to the second aspect of the present invention, since it is possible to provide countermeasures as above, it is possible to avoid the occurrence of the voltage abnormality.

Also, in the second aspect of the present invention, in the resistance calculation step, it is preferable that the resistance is calculated based on a current and voltage in charging the all-solid battery when the battery has a charging state of 0% or more and 20% or less. Since this configuration makes it easy to increase the correlation coefficient $R_2$ between the IV input resistance and the battery capacity at which the voltage abnormality occurs, it is possible to improve the calculation accuracy of the battery capacity at which the voltage abnormality occurs.

Also, in the second aspect of the present invention, in the resistance calculation step, it is preferable that the resistance is calculated based on a current and voltage when the battery is charged at a constant current, and it is more preferable that the charging rate of the constant current is 10 C or less. Since this configuration makes it easy to increase the correlation coefficient $R_2$ between the IV input resistance and the battery capacity at which the voltage abnormality occurs, it is possible to improve the calculation accuracy of the battery capacity at which the voltage abnormality occurs.

Effects of the Invention

According to the present invention, it is possible to provide an apparatus and method for inspecting an all-solid battery with which a battery capacity at which a voltage abnormality occurs can be grasped before the voltage abnormality occurs.

DETAILED DESCRIPTION OF THE INVENTION

As a method for examining a condition of a secondary battery, for example, there is a method for measuring an internal impedance described in Japanese Patent Application Laid-Open Publication No. 2007-85772. However, since the resistance of a cathode is larger than that of an anode in an all-solid battery, it is difficult to identify a state of the anode by measuring the internal impedance. Even by measuring the resistance (hereinafter, this resistance is referred to as "IV output resistance") obtained by observing the voltage while discharging at a constant current in order to examine the state of the all-solid battery, it is also difficult to identify the state of the anode. Based on the above, the inventor of the present invention considered measuring the IV input resistance.

Here, even though the IV input resistance is measured at a high SOC range, it is difficult to identify the state of the anode. Also, since the voltage abnormality tends to occur at the high SOC range, if the IV input resistance is measured at a high SOC range, possibly the voltage abnormality occurs to make the battery itself defected. In contrast, in a case where the IV input resistance is measured at a low SOC range, there is no need to concern about the occurrence of the voltage abnormality. Also, the resistance of the anode at a low SOC range is high in the all-solid battery. Therefore, it is considered that the correlation between the battery capacity at which the voltage abnormality occurs and the IV input resistance of the all-solid battery measured at a low SOC range becomes strong, whereby it becomes easy to judge the quality of the all-solid battery (quality of the anode layer provided to the all-solid battery), before the voltage abnormality occurs.

Hereinafter, with reference to the drawings, the present invention will be described. It should be noted that, the embodiments shown below are examples of the present invention and the present invention is not limited to these embodiments.

Figure 1:
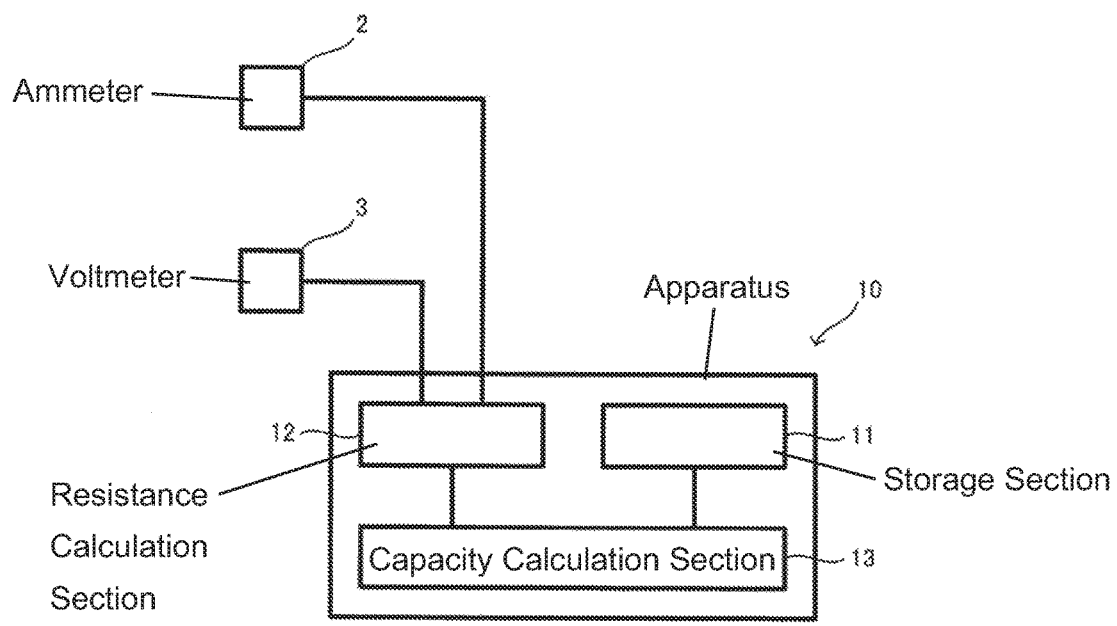
FIG. 1 is a view to explain an apparatus 10 for inspecting an all-solid battery of the present invention.

FIG. 1 is a view to explain an apparatus 10 (hereinafter sometimes referred to as "the apparatus 10 of the present invention" for short) for inspecting an all-solid battery. As shown in FIG. 1, the apparatus 10 of the present invention includes a storage section 11, a resistance calculation section 12, and a capacity calculation section 13. The storage section 11 is a section for storing the relationship between the battery capacity at which the voltage abnormality occurs in the all-solid battery and the resistance of the all-solid battery. A known storage medium can be adequately employed as the storage section 11. The resistance calculation section 12 is a section for calculating the resistance based on the current detected by means of an ammeter 2 in charging the all-solid battery and the voltage detected by means of a voltmeter 3 in charging the all-solid battery. The capacity calculation section 13 is a section for calculating the battery capacity at which the voltage abnormality occurs in the all-solid battery in which the current and voltage are detected by means of the ammeter 2 and the voltmeter 3, from the above relationship stored in the storage section 11 and the resistance calculated by the resistance calculation section 12. A processing device such as a CPU can be adequately employed for the resistance calculation section 12 and the capacity calculation section 13.

Figure 2:
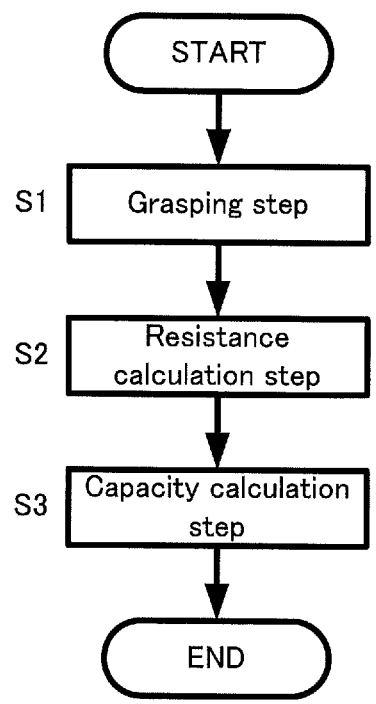
FIG. 2 is a view to explain a method for inspecting an all-solid battery of the present invention.

FIG. 2 is a view to explain a method (hereinafter sometimes simply referred to as "the present invention") for inspecting an all-solid battery of the present invention. As shown in FIG. 2, the present invention includes a grasping step (S1), a resistance calculation step (S2), and a capacity calculation step (S3).

Figure 4:
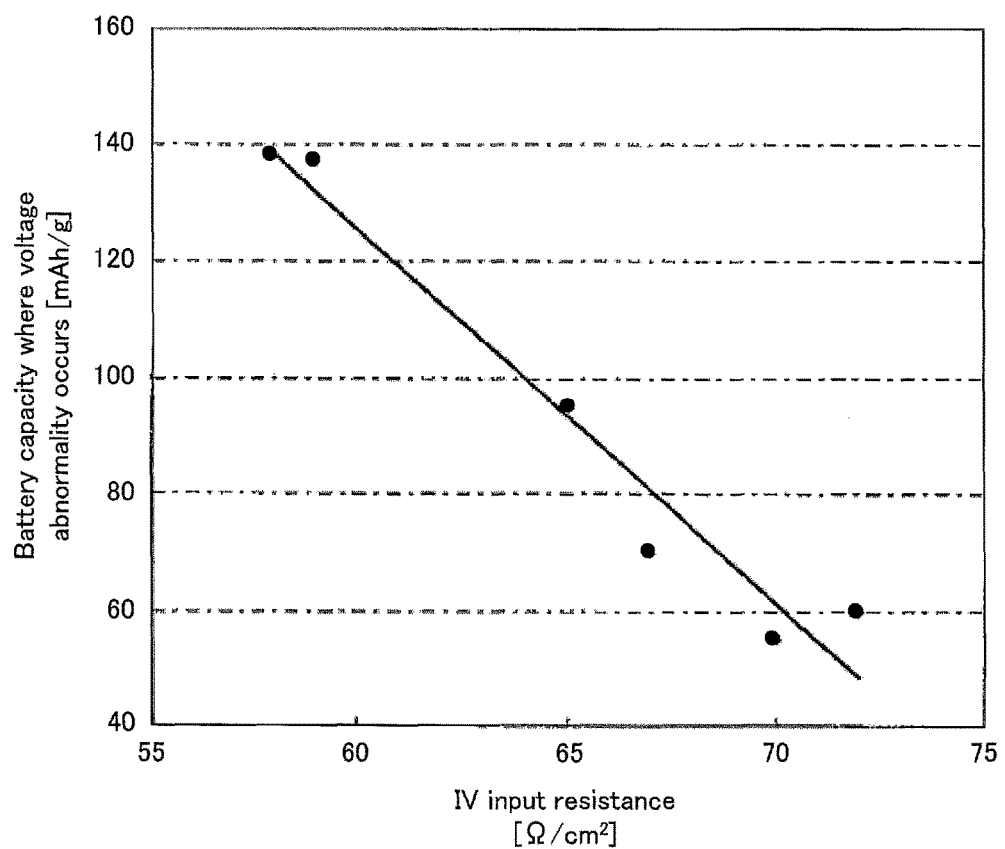
FIG. 4 is a view to explain one example of relationship between a battery capacity at which a voltage abnormality occurs and an IV input resistance.

The grasping step (hereinafter sometimes referred to as "S1") is a step of grasping the relationship between the battery capacity at which the voltage abnormality occurs in the all-solid battery and the resistance (IV input resistance) in a case where charging is carried out when the all-solid battery has a predetermined value or less of state of charge. S1 is, for example, a step of grasping the relationship (regression line) as shown in FIG. 4 which is explained in Examples. The configuration of S1 is not particularly limited as long as the relationship between the battery capacity at which the voltage abnormality occurs and the IV input characteristic can be grasped. In S1, the battery capacity at which the voltage abnormality occurs in the all-solid battery can be identified by rapidly charging at a predetermined charging rate for example. Also, in S1, the IV input resistance (R) can be calculated, for example, by assigning the voltage (V) to R=V/I, the voltage being obtained by monitoring the voltage of the all-solid battery at a specific time (for example, a few seconds after charging is started) in charging the battery for a predetermined time (for example, around from a few seconds to several tens of seconds) at a charging rate of 10 C or less, when the SOC of the battery is 0% or more and 20% or less. As described above, obtaining the battery capacity at which the voltage abnormality occurs and the IV input resistance, the relation as shown in FIG. 4 can be grasped by plotting the results regarding the battery capacity at which the voltage abnormality occurs and the IV input resistance to a graph, in which the battery capacity [mAh/g] at which the voltage abnormality occurs is taken along the vertical axis and the IV input resistance [$\Omega/cm^2$] is taken along the horizontal axis.

The resistance calculation step (hereinafter sometimes referred to as "S2") is a step of: after S1, charging an all-solid battery produced with the same materials as that of the all-solid battery in which the relationship is grasped in S1, whose state of charge is of a predetermined value or less; and observing the voltage of the all-solid battery in charging, then calculating the resistance (IV input resistance) of the all-solid battery. As described above, there is a strong correlation (in the example of FIG. 4, a strong negative correlation) between the battery capacity at which the voltage abnormality occurs and the IV input resistance of the all-solid battery measured at a low SOC range. Therefore, after grasping the relationship between the battery capacity at which the voltage abnormality occurs and the IV input resistance in S1, in order to estimate the battery capacity at which the voltage abnormality occurs in the capacity estimate step described later, under the same conditions as in calculation of the IV input resistance in S1, the IV input resistance of the all-solid battery whose battery capacity at which the voltage abnormality occurs is to be estimated is calculated.

The capacity calculation step (hereinafter sometimes referred to as "S3") is a step of calculating the battery capacity at which the voltage abnormality occurs in the all-solid battery, by applying the IV input resistance calculated in S2 to the relationship grasped in S1. Since there is a strong correlation between the battery capacity at which the voltage abnormality occurs and the IV input resistance measured at a low SOC range, by applying the IV input resistance calculated in S2 to the relationship grasped in S1, it is possible to estimate the battery capacity at which the voltage abnormality occurs when the all-solid battery is rapidly charged, before the voltage abnormality actually occurs in the all-solid battery to be inspected. If the battery capacity of the all-solid battery is less than the battery capacity at which the voltage abnormality occurs, it can be estimated that the voltage abnormality does not occur, and if the battery capacity of the all-solid battery is same as or more than the battery capacity at which the voltage abnormality occurs, it can be estimated that the voltage abnormality occurs. Therefore, according to the method of the present invention and the apparatus 10 of the present invention with which the method can be carried out, it is possible to grasp the battery capacity at which the voltage abnormality occurs, before the voltage abnormality occurs.

The all-solid battery to be inspected by the present invention (hereinafter the battery sometimes referred to as "the all-solid battery to be inspected") includes a cathode layer, an anode layer, and a solid electrolyte layer disposed between them, wherein an electric power is taken out via a cathode current collector connected to the cathode layer and an anode current collector connected to the anode layer.

Examples of the cathode active material to be contained in the cathode layer of the all-solid battery to be inspected include: lithium compounds such as nickel-cobalt-lithium manganate ($LiNi_xCo_{2-x-y}Mn_yO_2$), lithium cobalt oxide ($LiCoO_2$), lithium nickelate ($LiNiO_2$), lithium manganate ($LiMnO_2$), iron olivine ($LiFePO_4$), cobalt olivine ($LiCoPO_4$), manganese olivine ($LiMnPO_4$), and lithium titanate ($Li_4Ti_5O_{12}$); chalcogenides such as copper chevrel ($Cu_2Mo_6S_8$), iron sulfide (FeS), cobalt sulfide (CoS), nickel sulfide (NiS) and the like.

Also, the average particle diameter of the cathode active material is, for example, preferably within a range of 1 μm to 50 μm, more preferably within a range of 1 μm to 20 μm, especially preferably with in a range of 3 μm to 5 μm. If the average particle diameter of the cathode active material is too small, it may become difficult to handle, and if the average particle diameter of the cathode active material is too large, sometimes it is difficult to obtain a flat cathode active material layer. The average particle diameter of the cathode active material can be obtained for example by measuring particle diameters of active material carriers observed by means of a scanning electron microscope (SEM) to average out the diameters.

Also, as an electrolyte which can be employed for the cathode layer of the all-solid battery to be inspected, a solid electrolyte such as solid oxide electrolytes and solid sulfide electrolytes is preferably employed. Examples of the solid oxide electrolytes include, in specific, LiPON (lithium phosphorus oxynitride), $Li_{1.3}Al_{0.3}Ti_{0.7}(PO_4)_3$, $La_{0.51}Li_{0.34}TiO_{0.74}$, $Li_3PO_4$, $Li_2SiO_2$, $Li_2SiO_4$ and the like. Examples of the solid sulfide electrolytes, in specific, $Li_2S$—$P_2S_5$ ($Li_2S:P_2S_5=50:50\sim100:0$), $Li_2S$—$SiS_2$, $Li_{3.25}P_{0.25}Ge_{0.76}S_4$, $Li_2O$—$Li_2S$—$P_2S_5$, $Li_2S$—$SiS_2$—LiI, $Li_2S$—$SiS_2$—LiBr, $Li_2S$—$SiS_2$—LiCl, $Li_2S$—$SiS_2$—$B_2S_3$—LiI, $Li_2S$—$SiS_2$—$P_2S_5$—LiI, $Li_2S$—$B_2S_3$, $Li_2S$—$P_2S_5$-ZmSn (Z=Ge, Zn, Ga), $Li_2S$—$GeS_2$, $Li_2S$—$SiS_2$—$Li_3PO_4$, $Li_2S$—$SiS_2$—$Li_xMO_y$ (M=P, Si, Ge, B, Al, Ga, In) and the like. Besides, a polymer electrolyte, a gel electrolyte and the like can be employed for the cathode layer of the all-solid battery to be inspected. In a battery provided with a liquid electrolyte (electrolytic solution), since SEI (Solid Electrolyte Interface. The same is applied hereinafter) is created to the anode due to decomposition of the electrolytic solution, the anode is difficult to affect the voltage of the battery. In contrast, in a battery provided with a solid electrolyte, since SEI is difficult to be created to the anode, the anode largely affects the voltage of the battery at a low SOC range. Therefore, the above electrolytes can be adequately employed for the all-solid battery to be inspected.

Also, in a case where a solid sulfide electrolyte is employed for the all-solid battery to be inspected, in view of having a configuration in which the increase in the battery resistance is easy to be prevented by making a high resistance layer difficult to be formed at an interface between the cathode active material and the solid electrolyte, the cathode active material is preferably covered with an ion-conducting oxide. Examples of the lithium ion-conducting oxide to cover the cathode active material include an oxide represented by a general formula $Li_xAO_y$ (A is B, C, Al, Si, P, S, Ti, Zr, Nb, Mo, Ta, or W, and x and y are positive numbers, respectively). In specific, $Li_3BO_3$, $LiBO_2$, $Li_2CO_3$, $LiAlO_2$, $Li_4SiO_4$, $Li_2SiO_3$, $Li_3PO_4$, $Li_2SO_4$, $Li_2TiO_3$, $Li_4Ti_5O_{12}$, $Li_2Ti_2O_5$, $Li_2ZrO_3$, $LiNbO_3$, $Li_2MoO_4$, $Li_2WO_4$ and the like can be exemplified. Also, the lithium ion-conducting oxide may be a composite oxide. As the composite oxide to cover the cathode active material, an arbitrary combination of the above lithium ion-conducting oxides can be employed, and for example, $Li_4SiO_4$—$Li_3BO_3$, $Li_4SiO_4$—$Li_3PO_4$ and the like can be given. Also, in a case where a surface of the cathode active material is covered with the ion conducting oxide, it is only necessary that the ion conducting oxide covers at least a part of the cathode active material, and the ion conducting oxide can cover the whole surface of the cathode active material. Also, the thickness of the ion conducting oxide to cover the cathode active material is, for example, preferably 0.1 nm or more and 100 nm or less, and more preferably 1 nm or more and 20 nm or less. The thickness of the ion conducting oxide can be measured by means of a transmission electron microscope (TEM) and the like for example.

Also, if necessary, a conductive assistant, a binder and the like can be contained to the cathode layer of the all-solid battery to be inspected. In a case where the conductive assistant is used, the conductive assistant is not particularly limited as long as it is possible to improve the conductivity of the cathode layer, and for example, a carbon black and the like can be used. Also, the content of the conductive assistant in the cathode layer can be determined depending on the kind of the conductive assistant, and for example it can be 1% or more and 10% or less by weight.

Examples of the binder which can be used for the cathode layer of the all-solid battery to be inspected include polyvinylidene fluoride (PVDF), polytetrafluoroethylene (PTFE) and the like. The content of the binder in the cathode layer is not particularly limited as long as the binder can immobilize the cathode active material and the like, and preferably, it can be for example 1% or more and 10% or less by weight.

Also, the thickness of the cathode layer of the all-solid battery to be inspected can be determined depending on the use application and the like of the all-solid battery. Specifically, the thickness is preferably 10 µm or more and 250 µm or less, more preferably 20 µm or more and 200 µm or less, and most preferably 30 µm or more and 150 µm or less.

The cathode layer of the all-solid battery to be inspected which is configured as above can be produced with a known method. For the cathode current collector connected to the cathode layer, for example, aluminum, SUS, nickel, iron, copper, titanium and the like can be used, and aluminum and SUS are preferably used. The cathode current collector is for example formed into a foil, sheet, mesh and the like, and it is preferable to be formed into a foil.

Also, the anode active material to be contained in the anode layer of the all-solid battery to be inspected is not particularly limited as long as the anode active material can store/release metal ions, and for example: alkali metals such as lithium, sodium, and potassium; group 2 elements such as magnesium and calcium; group 13 elements such as aluminum; transition metals such as zinc, iron, copper, and nickel; and alloys and compounds containing those metals can be given. As examples of the anode active material containing lithium element, lithium compounds such as metal lithium and lithium titanate ($Li_4Ti_5O_{12}$), metal alloys such as $Li_3Ni_2Sn_7$, metal oxides, metal sulfides, metal nitrides, and carbon materials such as graphite can be given. The anode active material can be formed into powder or a thin film.

Also, to the anode layer of the all-solid battery to be inspected, the above electrolyte which can be employed for the cathode layer of the all-solid battery to be inspected can be contained.

Also, if necessary, a conductive assistant, a binder and the like can be contained in the anode layer of the all-solid battery to be inspected. For the anode layer, the conductive assistant and binder that can be employed for the cathode layer can be used, and the used amounts of the conductive assistant and the binder are preferably determined depending on the use application and the like of the all-solid battery.

Also, the thickness of the anode layer of the all-solid battery to be inspected can be determined depending on the use application and the like of the all-solid battery. Specifically, the thickness is preferably 10 µm or more and 100 µm or less, and more preferably 10 µm or more and 50 µm or less.

The anode layer of the all-solid battery to be inspected which is configured as above can be produced with a known method. The material and shape of the anode current collector to be connected to the anode layer can be adequately chosen from the materials and shapes of the cathode current collector described above.

Also, to the solid electrolyte layer of the all-solid battery to be inspected, the above electrolyte which can be employed for the cathode layer of the all-solid battery to be inspected can be contained. The solid electrolyte layer can be produced by pressing the above solid electrolyte for example. In addition, the solid electrolyte layer can be produced by going through a step of applying a composition in a slurry form produced by mixing the above solid electrolyte and a solvent to the cathode layer, the anode layer and the like.

The all-solid battery to be inspected provided with the cathode current collector, the cathode layer, the solid electrolyte layer, the anode layer, and the anode current collector that are configured by the above materials and the methods, is used being accommodated in a known laminate film (including a laminate film with a metal(s) evaporated thereto) or a known housing for example.

In the above explanation regarding the present invention, a configuration in which the IV input resistance of the all-solid battery whose SOC is 0% or more and 20% or less is calculated is exemplified. However, the present invention is not limited to this configuration. In the present invention, the SOC is not particularly limited as long as the state of the anode can be identified. However, in view of having a configuration in which the state of the anode is easy to be identified and the like, the SOC is preferably 0% or more and 20% or less, and more preferably 0% or more and 10% or less.

Also, in the above explanation regarding the present invention, a configuration in which the IV input resistance of the all-solid battery charged at a charging rate of 10 C or less is calculated is exemplified. However, the present invention is not limited to this configuration. In view of having a configuration in which the battery capacity at which the voltage abnormality occurs can be estimated with a high accuracy, it is preferable that the IV input resistance is calculated based on a current and voltage when the battery is charged with a constant current. Preferably the charging rate of the constant current is 10 C or less, and more preferably 7 C or less.

Also, in the above explanation regarding the present invention, a configuration in which the all-solid battery is a lithium-ion secondary battery is exemplified. However, the present invention is not limited to this configuration. The all-solid battery to be inspected with the present invention can have a configuration in which ions other than lithium ions transfer between the cathode layer and the anode layer. As the ions, sodium ions, potassium ions and the like can be exemplified. In a case where the ions other than lithium ions transfer, the cathode active material, the solid electrolyte, and the anode active material can be adequately chosen depending on the ions to transfer.

As described above, since there is a strong correlation between the battery capacity at which the voltage abnormality occurs and the IV input resistance, for example by adding a step of measuring the IV input resistance to the manufacturing steps of the battery as a quality inspection step, it is possible to judge the quality of the battery in a short time. Also, by measuring the IV input resistance when a vehicle provided with the all-solid battery is rapidly charged or when the vehicle is applied to a safety check, it is possible to judge the quality of the battery in the vehicle without destroying (without causing the voltage abnormality) the battery. Accordingly, it becomes possible to provide countermeasures such as replacement of the battery judged as a defective and reduction of the charging rate of the rapid charging.

EXAMPLES

All-solid batteries were produced. For each of the produced all-solid batteries, the relationship between the battery capacity at which the voltage abnormality occurs and the IV input resistance, the relationship between the battery capacity at which the voltage abnormality occurs and the IV output resistance, and the relationship between the battery capacity at which the voltage abnormality occurs and the results of impedance measurement were examined.

1. Production of all-Solid Battery

Figure 3:
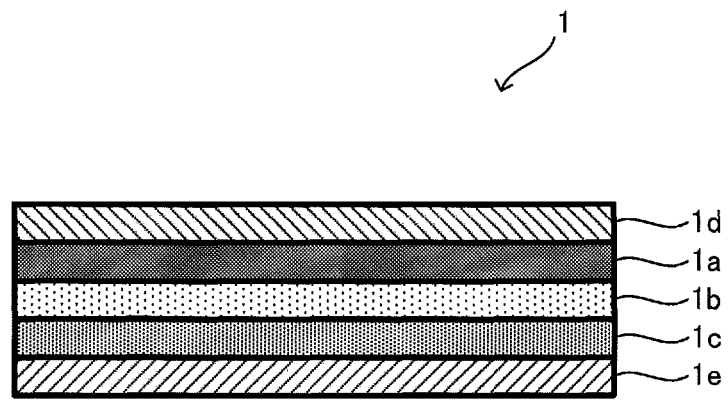
FIG. 3 is a view to explain an all-solid battery 1.

All-solid batteries were produced with: nickel-cobalt-lithium manganate covered with $LiNbO_3$ as a cathode active material; $Li_2S$—$P_2S_5$ produced by means of the same method as the method disclosed in Japanese Patent Application Laid-Open Publication No. 2005-228570 as a solid electrolyte; graphite as an anode active material; an Al foil as a cathode current collector; and a Cu foil as an anode current collector. The cathode layer was produced by going through a process of applying a composition on a surface of the cathode current collector. The composition was in a slurry form containing a mixture of the cathode active material and the solid electrolyte so that the volume ratio thereof is the cathode active material:solid electrolyte=6:4. The anode layer was produced with a process of applying a composition on a surface of the anode current collector. The composition was in a slurry form containing a mixture of the anode active material and the solid electrolyte so that the volume ratio thereof is the anode active material:the solid electrolyte=6:4. Then, the cathode layer formed on the surface of the cathode current collector, the solid electrolyte layer, and the anode layer formed on the surface of the anode current collector were laminated such that the solid electrolyte layer was disposed between the cathode layer and the anode layer to produce a battery pellet. The battery pellet went through a process of pressing at 4.3 $tf/cm^2$ ($\approx$421.4 MPa), whereby six all solid batteries were produced (1 cell to 6 cell). The configuration of the produced all-solid batteries is shown in FIG. 3. The all-solid battery 1 shown in FIG. 3 includes a cathode layer 1a, an anode layer 1c, a solid electrolyte layer 1b disposed between the cathode layer 1a and the anode layer 1c, a cathode current collector 1d connected to the cathode layer 1a, and an anode current collector 1e connected to the anode layer 1c. In order to secure a wide data point, each solid electrolyte to be employed for each of 1 cell to 6 cell was made to have a different conductivity from each other. In specific, the conductivity of the solid electrolyte to be mixed with the anode active material was made to be 6 cell<4 cell<1 cell<2 cell<3 cell<5 cell.

2. Evaluation Method

For each of the produced 6 all-solid batteries, an evaluation shown below was carried out. The 6 all-solid batteries were left under a temperature environment of 25° C. for 3 hours. Thereafter, charging and discharging were carried out at ⅓ C rate. After that, the IV output resistance at SOC of 20% and SOC of 60% were measured for 5 seconds in each case of 7 C rate and 10 C rate. Thereafter, a charging and discharging was carried out at 1.5 C rate, to measure the battery capacity at which the voltage abnormality occurs at 1.5 C to each of the 6 all-solid batteries. Thereafter, each of the IV input resistances at SOC of 0%, 20%, and 60% was measured for 5 seconds in each case of 7 C rate and 100 C rate. Also, by measuring AC impedances by means of an AC impedance apparatus manufactured by Solartron Metrology, a DC resistance and reaction resistance at SOC 20% were measured. The resistance from an origin of a cole-cole plot to the starting point of the circular arc was set as the DC resistance and the resistance from the starting point of the circular arc to the end was set as the reaction resistance.

3. Measurement Results

Measurement results are shown in Table 1. The correlation coefficient $R_2$ in Table 1 shows values rounded off to two decimal places. In Table 1, "DC" shows DC resistance and "reaction" shows reaction resistance. Also, the relationship between the IV input resistance measured for the first 5 seconds when the all-solid battery having a SOC of 0% was charged at 7 C rate and the battery capacity at which the voltage abnormality occurs is shown in FIG. 4. The battery capacity [mAh/g] at which the voltage abnormality occurs is taken along the vertical axis and the IV input resistance [Ω/cm$^2$] is taken along the horizontal axis.

TABLE 1

|  |  |  | 1 cell | 2 cell | 3 cell | 4 cell | 5 cell | 6 cell | $R^2$ |
|---|---|---|---|---|---|---|---|---|---|
| IV input resistance [Ω/cm$^2$] | SOC 0% | 7 C | 65.1 | 67.4 | 58.2 | 70.5 | 59.3 | 72.1 | 0.96 |
|  |  | 10 C | 53.2 | 56.6 | 50.7 | 58.4 | 51.3 | 60.5 | 0.89 |
|  | SOC 20% | 7 C | 26.6 | 30.4 | 26.9 | 30.6 | 27.2 | abnormal | 0.71 |
|  |  | 10 C | 25.8 | abnormal | 26.6 | abnormal | 27.0 | abnormal | 0.86 |
|  | SOC 60% | 7 C | maximum | maximum | 33.1 | maximum | maximum | maximum | unmeasurable |
|  |  | 10 C | maximum | maximum | maximum | maximum | maximum | maximum | unmeasurable |
| IV output resistance [Ω/cm$^2$] | SOC 20% | 7 C | 57.6 | 57.3 | 70.5 | 58.6 | 61.2 | 76.3 | 0.00 |
|  |  | 10 C | 69.4 | 68.0 | 82.7 | 68.1 | 70.8 | 88.0 | 0.01 |
|  | SOC 60% | 7 C | 30.7 | 35.9 | 30.3 | 35.8 | 30.5 | 39.3 | 0.75 |
|  |  | 10 C | 31.0 | 36.3 | 31.2 | 36.2 | 31.3 | 40.0 | 0.70 |
| Impedance measurement [Ω/cm$^2$] | SOC 20% | DC | 4 | 4 | 5 | 5 | 5 | 4 | 0.26 |
|  |  | reaction | 16 | 17 | 10 | 13 | 11 | 16 | 0.55 |
| Capacity where voltage abnormality occurs in charging at 1.5 C [mAh/g] |  |  | 95 | 70 | 138 | 55 | 137 | 60 |  |

As shown in Table 1, compared with the IV output resistance and the impedance measurement, the IV input resistance had a strong correlation with a strong capacity at which the voltage abnormality occurs in the all-solid battery charged at 1.5 C rate. Especially, at SOC 0%, the correlation coefficient $R^2$ was 0.89 or more (0.89 at 10 C rate and 0.96 at 7 C rate), and there was a strong correlation between the IV input resistance and the battery capacity at which the voltage abnormality occurs. Also, as shown in Table 1, although the IV input resistance at SOC 20% also had a strong correlation with the battery capacity at which the voltage abnormality occurs in the all-solid battery, the voltage abnormality occurred in some of the batteries. The IV input resistance at SOC 60% could not be measured since the resistance presumed to be originated from the cathode layer was high to reach the maximum voltage (4.55V). Even if the battery whose IV input resistance could not be measured had not reached the maximum voltage, it is presumed that there would have been the voltage abnormality in the same way as in the measurement in which the SOC was 20%.

DESCRIPTION OF THE REFERENCE NUMERALS

1 all solid battery
1a cathode layer
1b solid electrolyte layer
1c anode layer
1d cathode current collector
1e anode current collector
2 ammeter
3 voltmeter
10 apparatus for inspecting all-solid battery
11 storage section
12 resistance calculation section
13 capacity calculation section

The invention claimed is:

1. An apparatus for inspecting an all-solid battery, the all-solid battery including a solid electrolyte layer, the apparatus comprising:
   a storage section storing a relationship between an all-solid battery capacity at which a voltage abnormality occurs in another all-solid battery having the same materials as the all-solid battery and a resistance of the other all-solid battery, wherein the voltage abnormality is a rapid lowering of the voltage of the all-solid battery that causes destruction to the all-solid battery; and
   a resistance calculation section that, when a state of charge of the all-solid battery is in a range of 0% to 20%, calculates a resistance based on a measured current and measured voltage while charging the all-solid battery, wherein an all-solid battery capacity at which the voltage abnormality occurs in the all-solid battery is determined based on the relationship stored in the storage section and the resistance calculated by the resistance calculation section.

2. The apparatus for inspecting the all-solid battery according to claim 1, wherein the resistance calculation section calculates the resistance based on a current and voltage in charging at a constant current.

3. The apparatus for inspecting the all-solid battery according to claim 2, wherein a charging rate of the constant current is 10 C or less.

4. An apparatus for inspecting an all-solid battery, the all-solid battery including a solid electrolyte layer, the apparatus comprising:
   a processor programmed to:
      store a relationship between an all-solid battery capacity at which a voltage abnormality occurs in another all-solid battery having the same materials as the all-solid battery and a resistance of the other all-solid battery, wherein the voltage abnormality is a rapid lowering of the voltage of the all-solid battery that causes destruction to the all-solid battery; and
      when a state of charge of the all-solid battery is in a range of 0% to 20%:
         calculate a resistance based on a measured current and a measured voltage while charging the all-solid battery; and determine, based on the stored relationship and the calculated resistance, an all-solid battery capacity at which the voltage abnormality occurs in the all-solid battery.

5. The apparatus for inspecting the all-solid battery according to claim 4, wherein the processor is programmed to calculate the resistance based on a current and voltage in charging at a constant current.

6. The apparatus for inspecting the all-solid battery according to claim 5, wherein a charging rate of the constant current is 10 C or less.

7. The apparatus for inspecting an all-solid battery according to claim 1, wherein, based on the determined all-solid battery capacity, a charging rate in rapid charging is reduced from an initial plan.

8. The apparatus for inspecting an all-solid battery according to claim 1, wherein, based on the determined all-solid battery capacity, the apparatus indicates that the all-solid battery should be replaced with another all-solid battery in which an occurrence of the voltage abnormality is not presumed.

9. The apparatus for inspecting an all-solid battery according to claim 4, wherein the processor is further programmed to: based on the determined all-solid battery capacity, reduce a charging rate in rapid charging from an initial plan.

10. The apparatus for inspecting an all-solid battery according to claim 4, wherein the processor is further programmed to: based on the determined all-solid battery capacity, indicate that the all-solid battery should be replaced with another all-solid battery in which an occurrence of the voltage abnormality is not presumed.

* * * * *